United States Patent [19]

Nishihara et al.

[11] Patent Number: 5,204,519

[45] Date of Patent: Apr. 20, 1993

[54] CLOSE-CONTACT IMAGE SENSING DEVICE HAVING A RESET SWITCH

[75] Inventors: Yoshio Nishihara, Kanagawa; Hiroyuki Miyake, Ebina; Mamoru Nobue, Tochigi, all of Japan

[73] Assignee: Fuji Xerox Co., Ltd., Tokyo, Japan

[21] Appl. No.: 503,613

[22] Filed: Apr. 3, 1990

[30] Foreign Application Priority Data

Apr. 5, 1989 [JP] Japan .................... 1-86471

[51] Int. Cl.⁵ .............................. H01J 40/14
[52] U.S. Cl. .................... 250/208.1; 257/431
[58] Field of Search .......... 250/208.1, 208.2; 357/30 L, 30 H, 30 D, 30 R, 30 P; 358/213.23, 213.26, 213.27

[56] References Cited

U.S. PATENT DOCUMENTS

| | | | |
|---|---|---|---|
| 4,413,188 | 11/1983 | Ozawa et al. | 250/208.1 |
| 4,682,203 | 7/1987 | Konda | 357/30 P |
| 4,703,169 | 10/1987 | Arita | 250/208.1 |
| 4,868,405 | 9/1989 | Nakamura | 357/30 |
| 4,973,833 | 11/1990 | Takada et al. | 250/208.1 |
| 4,977,304 | 12/1990 | Ino et al. | 250/208.1 |

*Primary Examiner*—David C. Nelms
*Assistant Examiner*—Que T. Le

*Attorney, Agent, or Firm*—Finnegan, Henderson, Farabow, Garrett, and Dunner

[57] ABSTRACT

A close-contact image sensing device has at least a plurality of blocks each including the combinations each consisting of a photo sensing element and a photo sensing element select switch connected in series to the photo sensing element, and a common signal line used, when an image signal is read in each block. A read signal flows through the common signal line. An amount of charge as is stored in an equivalent capacitor of the photo sensing element in accordance with an amount of light incident on the photo sensing element, is transferred to a capacitor connected to the common signal line by turning on the photo sensing element select switch. In the image sensing device, a reset switch is connected at one end to a node between the photo sensing element and the photo sensing element select switch, and at the other end to a ground point. A photo sensing element select signal, which is applied to the photo sensing element select switch in a block in which a read operation will be executed, is also applied as a reset signal to the reset switch in a block in which a read operation has been completed, whereby the charge as still left in the photo sensing element after the charge transfer is drained to the ground point.

8 Claims, 5 Drawing Sheets

CLOSE-CONTACT IMAGE SENSING DEVICE HAVING A RESET SWITCH

BACKGROUND OF THE INVENTION

1. Field of the Invention

The present invention relates to a close-contact image sensing device for reading an image without an afterimage.

2. Description of the Related Art

A close-contact image sensing device using photo sensing elements, such as photo diodes, has been known as an image sensing device of the type in which an image on an original is read with the same size as that of the original image (in one-to-one corresponding manner), viz., without reducing the size of the original image.

Figure 2:
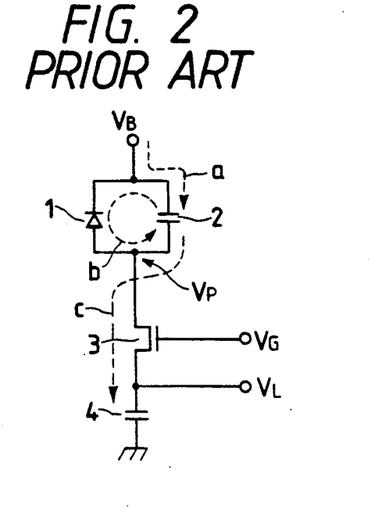
FIG. 2 is a circuit diagram showing a basic circuit used in a conventional close-contact image sensing device.
Figure 5:
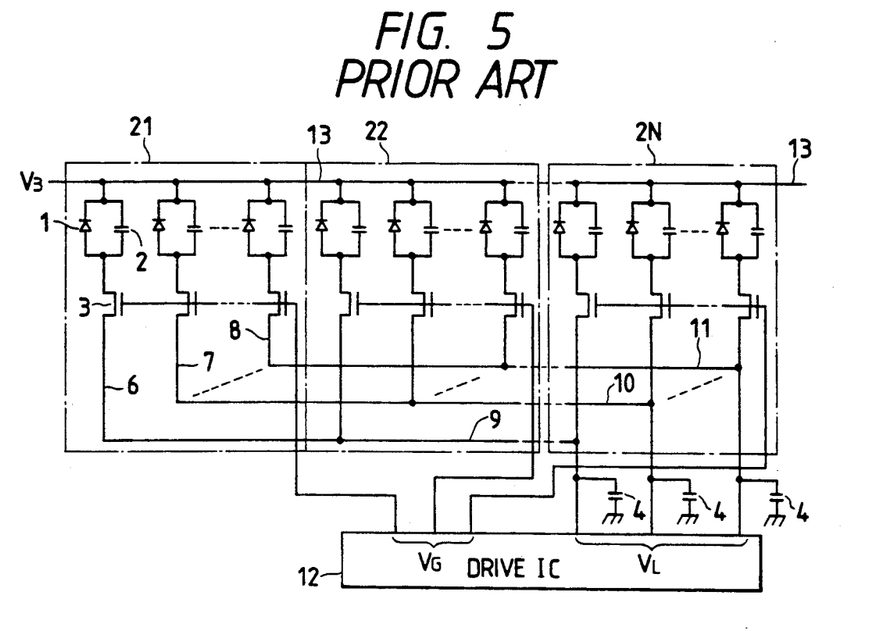
FIG. 5 is a circuit diagram showing the conventional close-contact image sensing device.

A conventional close-contact image sensing device is shown in FIG. 5, and its basic circuit is shown in FIG. 2. In those figures, reference numeral 1 designates a photo diode as a photo sensing element; 2, an equivalent capacitor; 3, a switch for selecting the photo sensing element; 4, a capacitor existing in connection with a common signal line; 6 to 8, read lines; 9 to 11, common signal lines; 12, a drive IC; 13, a bias line; 21, a first block; 22, a second block; 2N, an Nth block; $V_G$, a signal for selecting a photo sensing element; $V_L$, a read signal; $V_P$, an output signal of a photo diode.

The equivalent capacitor 2 has a capacitance that is the total of a capacitance between the electrodes of the photo diode 1, and a stray capacitance existing in connection with the photo diode 1, and others. The photo sensing element select switch 3 may be a thin-film transistor (TFT), for example. A group of the image signal read lines 6 to 8, and another group of common signal lines 9 to 11 are three-dimensionally arranged in a manner that the former group of lines intersects the latter group of lines, thereby to form a matrix circuit.

The basic circuit of the close-contact image sensing device will first be described, and then the whole of the image sensing device will be described.

The basic circuit shown in FIG. 2 will be described. The equivalent capacitance 2 is charged through a path (as indicated by a dotted line "a") originating from a bias power source $V_B$. The same is discharged through a path of a dotted line "b" in accordance with a light incident on the photo diode 1. Accordingly, the output voltage $V_P$ of the photo diode depends on the amount of the incident light.

When the photo sensing element select signal $V_G$ is applied to the gate of the photo sensing element select switch 3, and the switch is turned on, a part of the charges stored in the lower electrode of the equivalent capacitor 2 is transferred to the common signal line capacitor 4, by way of a path indicated by a dotted line "c". A voltage across the capacitor 4 varies with the charge transfer. At the instance that the charge transfer terminates, the voltage across the capacitor is read out as a read voltage $V_L$. As recalled, the voltage depends on the amount of the light incident on the photo diode 1. With the outputting of the voltage, an image has been read.

The closed-contact image sensing device shown in FIG. 5 will be described.

The image sensing device includes a plurality of blocks, each consisting a predetermined number of series circuits, each of which contains a photo diode 1 and a photo sensing element switch 3. In this instance, those blocks are denoted as 21 representative of a first block, 22 representative a second block, and 2N representative of an Nth block.

The select switches 3 in one block are turned on and off by a select signal $V_G$. Accordingly, the charge transfers in one block are simultaneously performed.

The charges are transferred through the read lines 6 to 8 connecting to the select switches 3 and the common signal lines 9 to 11, which are used as transfer paths from each block.

An image on an original can be read horizontally across the original from right to left and vice versa by sequentially shifting the timing of the select signal $V_G$ applied to each block. Such outputting of the select signal $V_G$ is controlled by the drive IC 12.

In the conventional image sensing device as described above, the output voltage $V_P$ of the photo diode after the charge transfer caused in response to the turn-on of the select switch, is left. The left voltage possibly causes an afterimage.

The afterimage phenomenon will be described with reference to FIGS. 4(a)–4(c), which show a set of waveforms useful in explaining an operation of the basic circuit of FIG. 2.

Figures 4A, 4C:
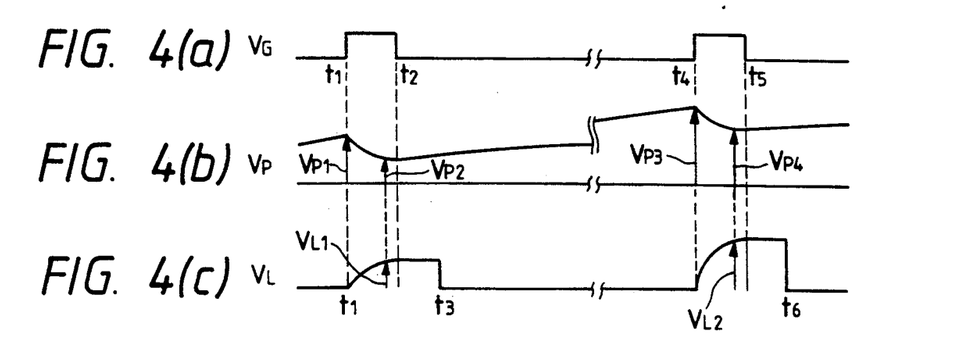

FIG. 4(a) shows a waveform of the photo sensing element select signal $V_G$; FIG. 4(b), a waveform of the photo diode output voltage $V_P$; FIG. 4(c), a waveform of the read voltage $V_L$.

Assuming that at time $t_1$, the voltage $V_P$, that has been increased by the charging through the path "b", is $V_{P1}$, and a capacitance of the equivalent capacitor 2 is $C_2$, a charge $Q_1$, that has been stored, is $$Q_1 = C_2 \times V_{P1} \qquad (1)$$

At time $t_1$, when the select signal $V_G$ is applied to the select switch 3, the switch is turned on and the charge transfer starts. Then, the output voltage $V_P$ of the photo diode gradually decreases, while the read voltage $V_L$ gradually increases. At the instant that both the voltages become equal to each other, the charge transfer terminates. Assuming that those voltages at the time of the termation of the charge transfer are $V_{P2}$ and $V_{L1}$, and a capacitance of the common signal line capaictor 4 is $C_4$, we have $$V_{P2} = V_{L1} = Q_1/(C_2 + C_4) \qquad (2).$$

After the voltage $V_{L1}$ is fetched by the drive IC 12 (FIG. 5), it is reset at a ground level (time $t_3$).

A charge $Q_2$ as left in the equivalent capacitor 2 at the time of the termination of the charge transfer is expressed by $$Q_2 = C_2 \times V_{P2} = C_2 Q_1/(C_2 + C_4) \qquad (3).$$

When light is incident on the photo diode 1, the equivalent capacitor 2 is charged again and the charging continues till the next select signal $V_G$ is inputted. The output voltage $V_P$ starts to increase from the voltage $V_{P2}$. Assuming that a peak voltage that the increasing voltage $V_P$ reaches is $V_{P3}$, and an amount of charge stored anew is $Q_3$, the following relation holds $$C_2 V_{P3} = Q_3 + C_2 Q_1/(C_2 + C_4) \qquad (4).$$

At time $t_4$, the next select signal $V_G$ is supplied and another charge transfer starts. As in the previous case, at the instant that a voltage across the equivalent capacitor 2 becomes equal to a voltage across the capacitor 4 ($V_{P4} = V_{L2}$), the charge transfer terminates. The read voltage $V_{L2}$ at this time is $$V_{L2} = Q_3/(C_2+C_4) + \{C_2/(C_2+C_4)\} \times V_{L1} \quad (5).$$

In the above equation, the first term describes the charge $Q_3$ that is charged during a period from time $t_2$ to $t_4$. Essentially, the charge that must be read out here is only this charge $Q_3$. Actually, however, the component of a second term is also read out, together with the charge of the first term.

When considering the facts that $V_{L1} = V_{P2}$ and $C_2 V_{P2}$ indicates the charge that is left in the equivalent capacitor 2 after the previous charge transfer, the second term indicates the component reflecting the left charge, that is, the afterimage for the precious image.

In the conventional image sensing device, $C_2 \ll C_4$ (e.g. $C_2 = 1$ pF and $C_4 = 100$ pF) and hence a ratio of the afterimage component to the whole read voltage is small (e.g., approximately 1% if $C_2:C_4 = 1:100$). Accordingly, the afterimage is negligible.

In recent days, however, designers are pressured to remove the afterimage for the following reasons.

(1) With advance of the microfabrication technology, the matrix circuit is extremely reduced in size. As a result, the capacitance $C_4$ of the common signal lines is small, but that ratio of the afterimage is large and is not negligible.

(2) Because of demands for further improvement of a read sensitivity, the capacitance $C_4$ must be reduced (a denominator of the equation (2), for example, is small). This also leads to increase of the ratio of the afterimage.

(3) There is a request that an image is read at a high gradation. To this end, the afterimage must be removed.

SUMMARY OF THE INVENTION

Accordingly an object of the present invention is to provide a close-contact image sensing device which is free from the above disadvantages.

The close-contact image sensing device comprising:

a plurality of blocks each including the combinations each consisting of a photodetecting element and a photo sensing element select switch connected in series to said photo sensing element;

a common signal line through which a read signal flows when an image signal is read in turn for said each block;

a capacitor, connected to said common signal line, to which an amount of charge as is stored in an equivalent capacitor of said photo sensing element in accordance with an amount of light incident on said photo sensing element is transferred by turning on said photo detecitng element select switch; and a reset swich connected at one end to a node between said photo sensing element and said photo sensing element select switch, and at the other end to a ground point, said reset switch being turned on for one block in which a read operation has been completed.

Other objects, features, and advantages of the invention will be apparent from the following description taken in connection with the accompanying drawings.

BRIEF DESCRIPTION OF THE DRAWINGS

FIGS. 3(a)-3(d) show a set of waveforms useful in explaining an operation of the basic circuit of FIG. 1;

FIGS. 4(a)-4(c) show a set of waveforms useful in explaining an operation of the basic circuit of FIG. 2;

FIGS. 8(a)-8(e) show a set of waveforms useful in explaining an operation of the image sensing device of FIG. 6;

DETAILED DESCRIPTION OF THE PREFERRED EMBODIMENTS

Basic Circuit

Figure 1:
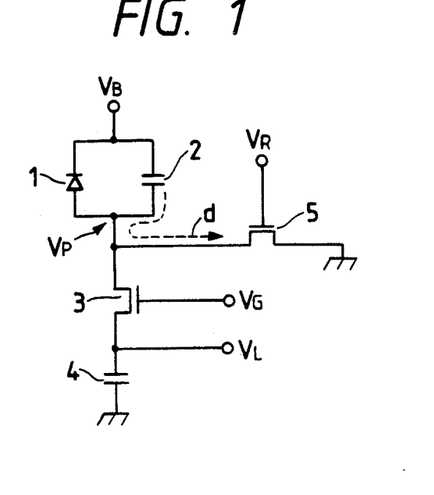
FIG. 1 is a circuit diagram showing a basic circuit used in a close-contact image sensing device according to the present invention.

FIG. 1 shows a basic circuit of a close-contact image sensing device according to the present invention. In the figure, like or equivalent portions are designated by like reference symbols in FIG. 1. In FIG. 1, reference numeral 5 designates a reset switch, and $V_R$ a reset signal. The reset switch may be a thin film transistor, for example.

An arrangement of FIG. 1 is different from that of FIG. 2 in that the reset switch 5 is provided, which is connected at one end to a node or a connecting point between the photo diode 1 and the photo sensing element select switch 3, and at the other end to a ground level.

The reset switch 5 provides a path through which the charge to cause the afterimage, viz., the charge left in the equivalent capacitor 2 after the charge transfer, goes to ground. This discharge operation will be described with reference to FIGS. 3(a)-3(d).

Figures 3A, 3D:
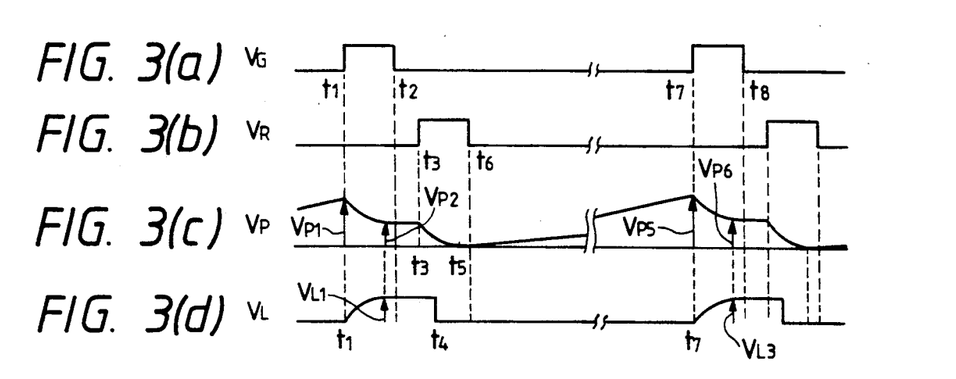

FIGS. 3(a)-3(d) show a set of waveforms useful in explaining the operation of the basic circuit of FIG. 1, FIG. 3(a) shows a variation of a photo sensing element select signal $V_G$; FIG. 3(b), a variation of a reset signal $V_R$; FIG. 3(c), a variation of a photo diode output voltage $V_P$; FIG. 3(d), a variation of a read voltage $V_L$.

An operation of the basic circuit from an instant that the select switch 3 is turned on till the charge transfer is performed, is the same as that of the conventional one. At the instant that the charge transfer terminates, the output voltage $V_P$ is equal to voltage $V_{P2}$, and the read voltage $V_L$ reaches voltage $V_{L1}$.

At time $t_3$ following time $t_2$ on which the select signal $V_G$ terminates, a reset signal $V_R$ is applied to the reset switch 5, and the switch is turned on. Under this condition, a path connecting the node between the photo diode and the equivalent capacitor 2 to the ground point is formed, and the charge left in the equivalent capacitor 2 is drained into ground point through the path. The drainage of the remaining charge influences a variation of the output voltage $V_P$ of the photo diode. Specifically, as shown in FIG. 3(c), the voltage $V_P$ gradually decreases from time $t_3$ and reaches the ground level at time $t_5$.

The storage of charge, which progresses with the next read operation, starts from this ground level. Therefore, a voltage $V_{L3}$ produced through the next read operation does not contain the afterimage component.

Thus, the close-contact image sensing device based on the basic circuit as mentioned above produces the read voltage $V_L$ not containing the afterimage component.

Close-Contact Image Sensing Device Based on the Basic Circuit

Figure 6:
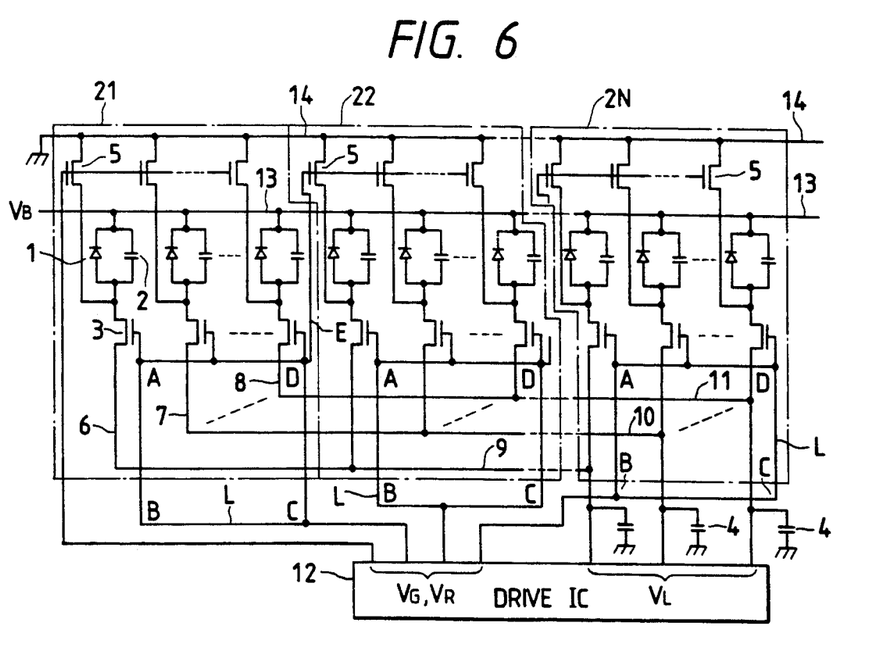
FIG. 6 is a circuit diagram showing the close-contact image sensing device according to an embodiment of the present invention.

A close-contact image sensing device according to an embodiment of the present invention is configured as shown in FIG. 6. Like or equivalent portions are designated by like reference symbols in FIGS. 1 and 5. In FIG. 6, reference numeral 14 designates a ground line set at the ground level; L gate line loops; A to D the corners of each gate line loop; E a line connecting the gate line of each select switch 3 with the gate of the reset switch 5.

In the arrangement, the instant image sensing device is different from the conventional image sensing device of FIG. 5 in that the reset switch 5 is provided for each photo diode, and by the switch, the charge as left in the equivalent capacitor 2 after the charge transfer is drained to the ground line 14.

Double Use of the Gate Signal

For generating the reset signal $V_R$ to turn on the reset switch 5, a means exclusively used for generating the reset signal may be provided. Alternatively, the signal $V_G$ for selecting the photo sensing element as already existed may be used for the reset signal. The latter is realized in a manner that the select signal $V_G$, which is applied to the block in which the read operation will be executed, is used as the reset signal $V_R$ to the block in which the read operation has been already executed.

In the close-contact image sensing device of FIG. 6, the read operation is performed in the direction from the right block to the left block (Nth block 2N to first block 21).

In the instance of FIG. 6, the select signal $V_G$ applied to the block in which the present read operation will be executed, is used as the rest signal $V_R$ to the block in which the read operation has been previously executed.

To be more specific, the select signal $V_G$ directed to the select switch 3 in the first block 21 is also applied through the line E to the gate of the reset switch 5 of the second block 22 in which the read operation has been previously executed.

Figures 8A, 8E:
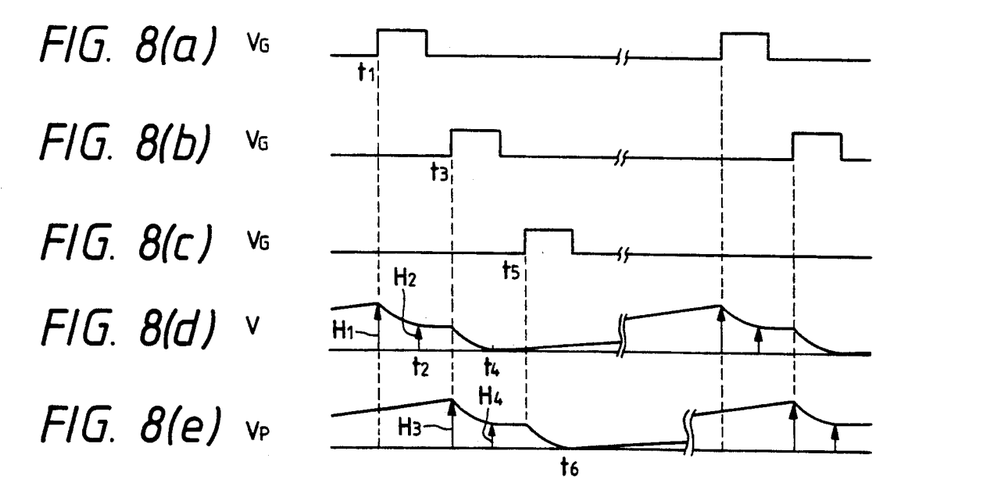

FIGS. 8(a)-8(e) show a set of waveforms useful in explaining the operation of the image sensing device of FIG. 6 when the select signal is doubly used as mentioned above. In FIG. 8(a), $V_{GK}$ indicates a waveform of the photo sensing element select signal supplied to a block. $V_{G(K+1)}$ in FIG. 8(b) indicates a waveform of the photo sensing element select signal supplied to a block in which the next read operation will be executed. $V_{G(K+2)}$ in FIG. 8(c) stands for a waveform of the photo sensing element select signal supplied to a block in which the second next read operation will be executed. $V_{PK}$ in FIG. 8(d) indicates a photo diode output voltage in the block which responds to the signal of FIG. 8(a) to execute the read operation. $V_{P(K+1)}$ in FIG. 8(e) represents a photo diode output voltage which responds to the signal of FIG. 8(b) to execute the read operation.

The photo diode output voltage $V_{PK}$ of a value $H_1$ at time point $t_1$ when the select signal $V_{GK}$ is inputted, decreases to a value $H_2$ at time point $t_2$ when the charge trnsfer terminates.

AT time point $t_3$, the select signal $V_{G(K+1)}$ is applied to the block in which the next read operation will be executed. The select signal turns on the select switch 3 in that block, and the charge transfer starts (as a result, the output voltage $V_{P(K+1)}$ decreases its value from $H_3$ to $H_4$). At the same time, the select signal turns on the reset switch 5 in the block in which the read operation has been previously executed, to drain the charge left in the equivalent capacitor 2 (as a result, the output voltage $V_{PK}$ starts to decrease toward the ground level and its value reaches the ground level at time point $t_4$).

Layout of the Gate Line to the Reset Switch

In the present invention, the gate line must be newly wired to the reset switch 5. A pulse signal flows through the gate line. Therefore, in wiring, care must be taken so as to prevent induction interference (cross talk) upon other elements, such as photo diodes.

Where the reset switch 5 is disposed on the opposite side of the select switch 3 with respect to the photo diode 1, in a direction of a surface of a substrate having the photo diode 1 formed thereon, if the gate signal is doubly used, the gate signal must be transferred through another region where the photo diode 1 is disposed.

Actually, because a number of photo diodes are closely laid out on the substrate, the gate signal flows through a path closest to the photo diode 1. There is a high possibility that the cross over occurs.

To cope with this, a laminated structure to be given below is proposed.

Figure 7:
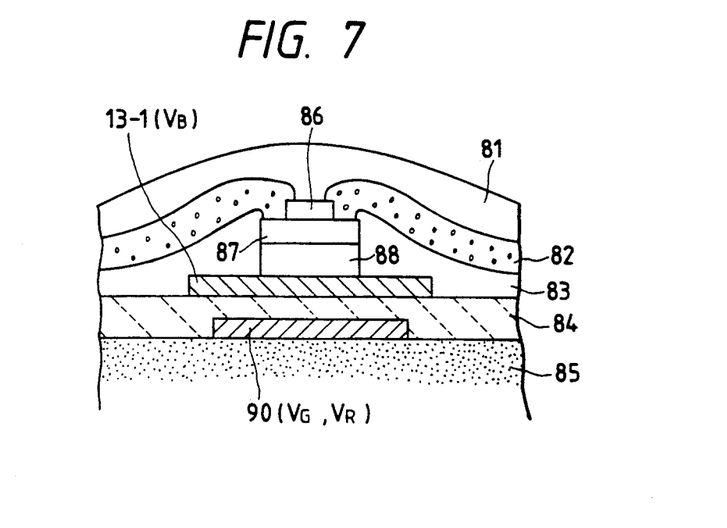
FIG. 7 is a sectional view showing a structure of a photo diode portion used in the image sensing device according to the present invention.

FIG. 7 shows an example of a laminated structure of a photo diode portion according to the present invention. In the figure, 81 designates a polyimide insulating layer; 82, an interconnection aluminum layer; 83, a polyimide insulating layer; 84, an SiN insulating layer; 85, a glass substrate; 86 a top insulating film; 87, an ITO (indium tin oxide) layer; 88, an a-Si layer; 13-1, a chromium layer for bias line; 90, a chromium layer for gate line.

The photo diode is constructed with the upper layers including the chromium layer 13-1.

The chromium layer 90 is used for the flow of a gate signal to the reset switch 5.

This structure is featured in that the chromium layer 13-1 constituting the bias line 13 (see FIG. 6, for example) is wide, and that the chromium layer 90 for the gate line is formed opposite to a region where the photo diode is disposed with respect to the layer 13, and is narrower than the width of the layer 13-1.

With such a structure, the chromium layer 13-1 set at a bias voltage covers the chromium layer 90, and hence it serves as a shield. Therefore, if a gate signal flows through the chromium layer 90 for the gate line, it will never give an induction interference to the photo diode located above the chromium layer 13-1 for the bias line.

Figure 9:
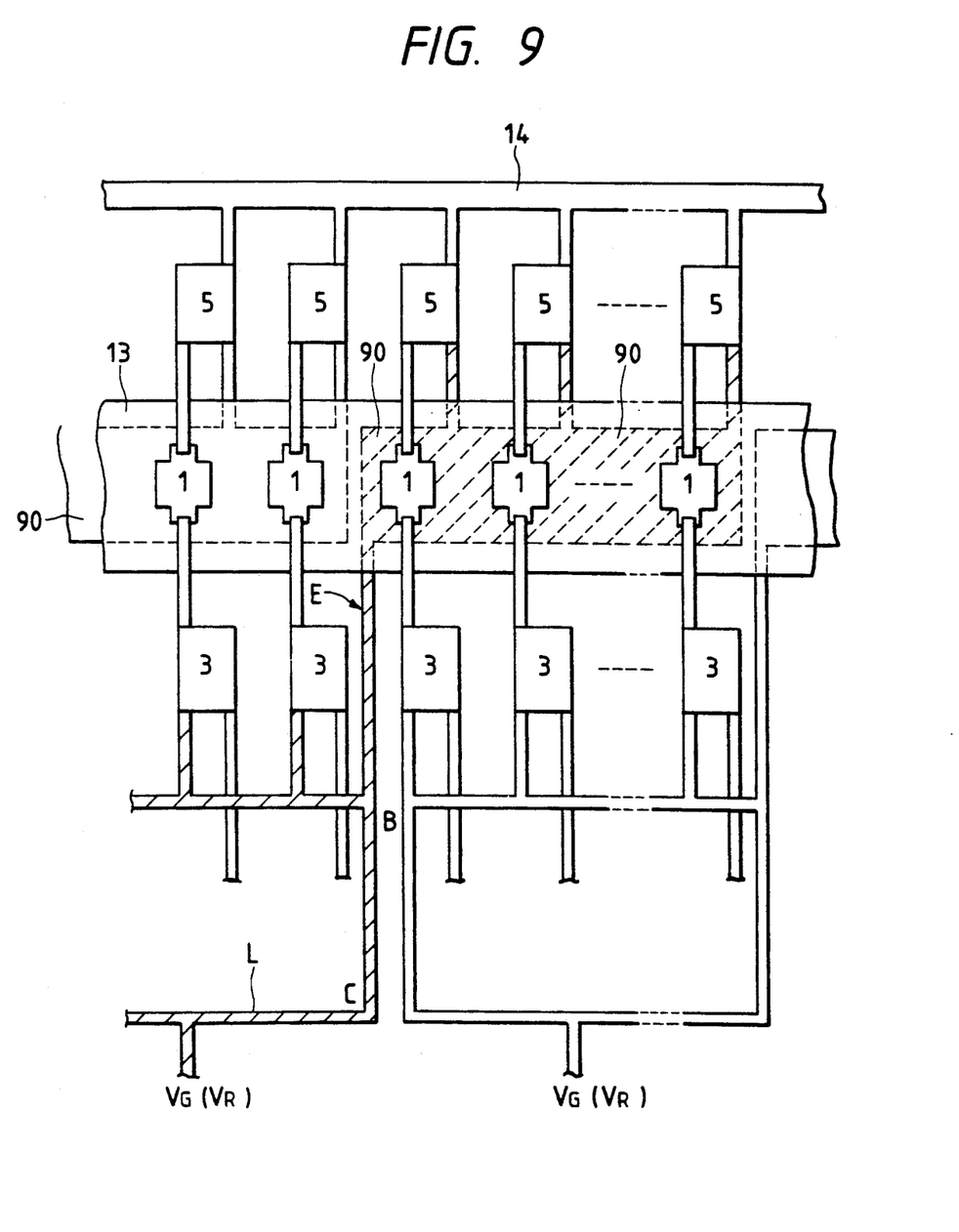
FIG. 9 is an enlarged plan view showing a part of the close-contact image sensing device of FIG. 6, in which a photo diode portion is structured as shown in FIG. 7.

FIG. 9 shows an enlarged plan view of a part of the photo diode portion of the close-contact image sensing device of FIG. 6, in which the diode portion is structured as shown in FIG. 7. The reference symbols used in FIGS. 6 and 7 are correspondingly applied to the present figure. For clear illustration of the double use of the gate signal, a set of gate lines interconnected is shaded in the illustration.

Paying attention to the shaded gate lines, a gate signal as a photo sensing element select signal $V_G$ is applied from the gate loop L to the photo detecting select switch 3.

A corner B as one of the corners of the gate line loop L is coupled with the chromium layer 90 by the line E. Through this line, a gate signal as a reset signal $V_R$ is applied to the reset switch 5.

As shown in FIG. 7, the chromium layer 90 for the gate line is disposed lower than the bias line 13. Accordingly, if the reset signal $V_R$ flows, no adverse effect is induced to the photo diode 1.

As seen from the foregoing description, to pass the gate line continuous to the reset switch 5 by the photo diode 1, the bias line 13 is wide, which is connected to the photo diode 1 and is layered under the photo diode, and the gate line narrower than the bias line 13 is layered under the bias line 13. The bias line 13 shields the photo diode 1 from the cross talk caused by the reset signal flowing through the gate line.

Wiring Pattern of Gate Lines

FIGS. 10 through 13 show wiring patterns of the gate lines according to the present invention.

Figure 10:
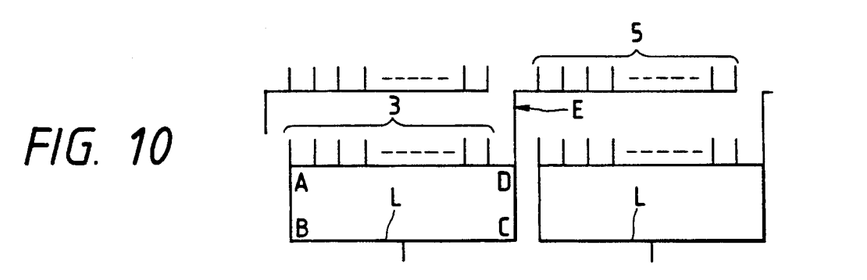
FIGS. 10 through 13 are plan views showing wiring patterns of gate lines used in the image sensing device according to the present invention.

In a pattern shown in FIG. 10, the select signal $V_G$ is transferred as a reset signal $V_R$ to the block in which the read operation has been just completed through the exclusive line E, as in the embodiment of FIG. 6.

Figure 11:
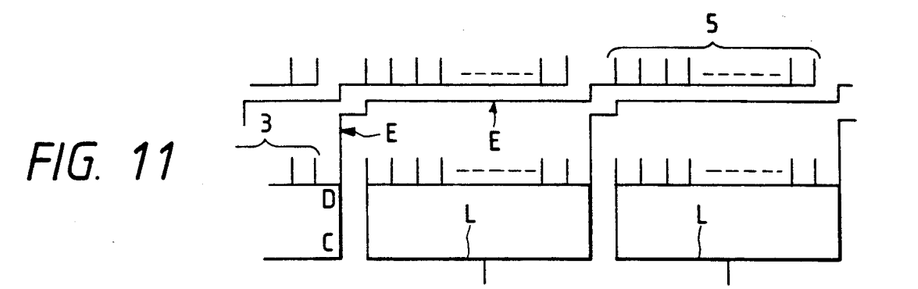

In a pattern shown in FIG. 11, the select signal $V_G$ is transferred as a reset signal $V_R$ to the block, in which the read operation has been completed, preceding to the previous one, through the exclusive line E.

Figure 12:
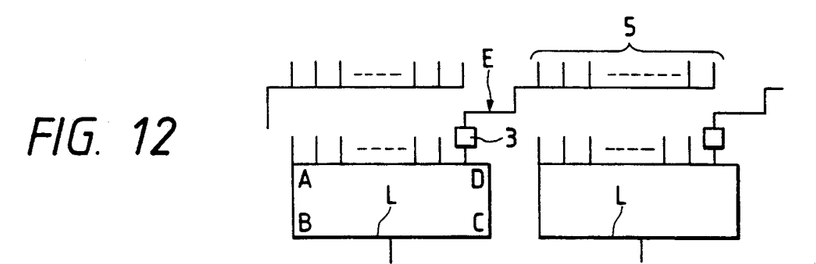

In a pattern shown in FIG. 12, the select signal $V_G$ is transferred as a reset signal $V_R$ to the block in which the read operation has been just completed, through one photo sensing element select switch 3, not the line E.

In this pattern, an operating load is placed on only the single select switch 3. Accordingly, use of the pattern is allowed only when no problems arise if the select switch is used in such an overload condition.

Figure 13:
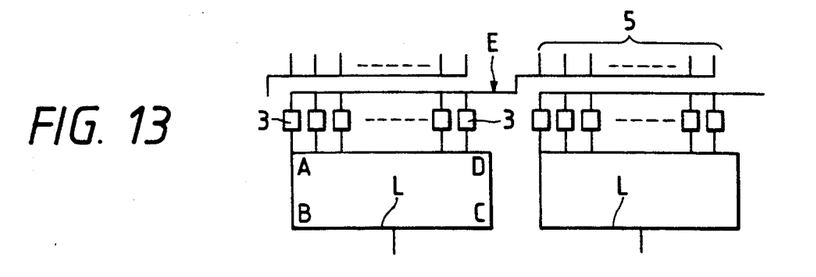

A pattern, which overcomes the above defect, is shown in FIG. 13. In this pattern, the operating load, is uniformly shared among all of the select switches in each block.

The close-contact image sensing device according to the present invention has the following advantageous effects.

(1) The afterimage can be removed.

After the charge is transferred to read an image signal, the charge is still left in the photo sensing element. The remaining charge causes an afterimage.

In the present invention, the reset switch is provided in a discharge path. That is, when the switch is closed, the discharge path is formed to allow the remaining charge to be drained to the ground point.

(2) A signal generating means exclusively used for generating a signal to drive the reset switch is not necessarily required.

A signal to turn on the photo sensing element select switch to transfer the charge in a block where the read operation will be executed, is used as a signal to turn on the reset switch in another block where the charge transfer has been completed. With this arrangement, the reset switch can be turned on at a required timing, without using additional signal generating means.

(3) For applying a gate signal to the select switch, a conductive layer, which is narrow and layered under the bias line above which the photo sensing element is formed, is used in the vicinity of the photo sensing element. Such a structure prevents an induction interference of the gate signal upon the photo sensing element.

While having described some specific embodiments, it should be understood that the present invention may variously be modified and changed within the scope and spirit of the appended claims.

What is claimed is:

1. A close-contact image sensing circuit, comprising:
   a photo sensing element for producing an image signal including an electric charge in response to light incident thereon, said photo sensing element having an equivalent capacitor for storing said charge;
   a signal line connected to said photo sensing element for transferring said charge from said photo sensing element;
   a photo sensing element select switch interposed between said signal line and said photo sensing element for selectively electrically connecting and disconnecting said photo sensing element from said signal line, said photo sensing element select switch being activated in accordance with a control signal;
   a storage capacitor connected to said signal line for storing said charge stored on said equivalent capacitor upon the activation of said photo sensing element select switch; and
   a reset switch, connected at one end between said photo sensing element and said photo sensing element select switch and connected at another end to a ground point, for discharging said charge stored on said equivalent capacitor upon being activated by a reset signal after said charge stored in said equivalent capacitor has been stored on said storage capacitor and read therefrom.

2. A close-contact image sensing device, comprising:
   an array of blocks, each block including at least one close-contact image sensing circuit, each of said circuits including
   a photo sensing element for producing an image signal including an electric charge in response to light incident thereon, said photo sensing element having an equivalent capacitor for storing said charge;
   a signal line connected to said photo sensing element for transferring said charge from said photo sensing element;
   a photo sensing element select switch interposed between said signal line and said photo sensing element for selectively electrically connecting and disconnecting said photo sensing element from said signal line, said photo sensing element select switch being activated in accordance with a control signal;
   a storage capacitor connected to said signal line for storing said charge stored on said equivalent capacitor upon the activation of said photo sensing element select switch; and
   a reset switch, connected at one end between said photo sensing element and said photo sensing element select switch and connected at another end to a ground point, for discharging said charge stored on said equivalent capacitor upon being activated by a reset signal after said charge stored in said equivalent capacitor has been stored on said storage capacitor and read therefrom.

3. The close-contact image sensing device of claim 2, wherein each of said blocks further includes:

a select signal transfer line for providing said select signal to activate said photo sensing element select switch; and a reset signal transfer line for providing said reset signal to activate said reset switch and wherein the select signal transfer line of each block in the array is connected to a reset signal transfer line of another block in said array.

4. The close-contact image sensing device of claim 3, wherein the select signal transfer line of each block in the array is connected to a reset signal transfer line of an adjacent block in said array.

5. The close-contact image sensing device of claim 3, wherein the select signal transfer line of each block in the array is connected to a reset signal transfer line of a block in said array which is two blocks from said block.

6. The close-contact image sensing device of claim 3, wherein said photo sensing element select switches and said reset switches comprise thin-film resistors.

7. The close-contact image sensing device of claim 3, wherein each of said close-contact image sensing circuits comprises a laminated structure including a substrate, a gate line formed above said substrate for providing the reset signal to said reset switch, a bias line formed above said gate line, and said photo sensing element formed above said bias line, said bias line shielding said photo sensing element from induction interference generated by the reset signal flowing through said gate line.

8. The close-contact image sensing device of claim 3, wherein each of said blocks includes a plurality of close-contact image sensing circuits and wherein the reset switches of said plurality of close-contact image sensing circuits are controlled by a common reset signal and the photo sensing element select switches of said plurality of close-contact image sensing circuits are controlled by a common select signal.

* * * * *